(12) United States Patent
Cheung et al.

(10) Patent No.: US 7,304,308 B2
(45) Date of Patent: Dec. 4, 2007

(54) AMORPHOUS SELENIUM FLAT PANEL X-RAY IMAGER FOR TOMOSYNTHESIS AND STATIC IMAGING

(75) Inventors: Lawrence Cheung, Wilmington, DE (US); Snezana Bogdanovich, Newark, DE (US); Elena Ingal, Newark, DE (US); Cornell L. Williams, North East, MD (US)

(73) Assignee: Hologic, Inc., Bedford, MA (US)

( * ) Notice: Subject to any disclaimer, the term of this patent is extended or adjusted under 35 U.S.C. 154(b) by 25 days.

(21) Appl. No.: 11/412,396

(22) Filed: Apr. 27, 2006

(65) Prior Publication Data

US 2006/0192131 A1    Aug. 31, 2006

Related U.S. Application Data

(63) Continuation-in-part of application No. 11/341,925, filed on Jan. 27, 2006, now Pat. No. 7,233,005, which is a continuation-in-part of application No. 11/059,282, filed on Feb. 16, 2005, now Pat. No. 7,122,803.

(51) Int. Cl.
*H01L 27/00* (2006.01)

(52) U.S. Cl. .................................. 250/370.09

(58) Field of Classification Search ............ 250/370.09
See application file for complete search history.

(56) References Cited

U.S. PATENT DOCUMENTS

| 5,132,541 | A | 7/1992 | Conrads et al. |
| 5,184,018 | A | 2/1993 | Conrads et al. |
| 5,198,673 | A | 3/1993 | Rougeot et al. |
| 5,319,206 | A | 6/1994 | Lee et al. |
| 5,396,072 | A | 3/1995 | Schiebel et al. |
| 5,436,101 | A | 7/1995 | Fender et al. |
| 5,528,043 | A | 6/1996 | Spivey et al. |
| 5,598,004 | A | 1/1997 | Powell et al. |

(Continued)

FOREIGN PATENT DOCUMENTS

| CA | 2184667 | 3/1998 |
| EP | 0826983 | 3/1998 |
| WO | WO9622616 | 7/1996 |

OTHER PUBLICATIONS

Yorker J. et al., "Characterization of a full field mammography detector based on direct x-ray conversion in selenium." Proc. SPIE 4682, 21-29 (2002).

(Continued)

*Primary Examiner*—David Porta
*Assistant Examiner*—Marcus H Taningco
(74) *Attorney, Agent, or Firm*—Cooper & Dunham LLP

(57) ABSTRACT

A flat panel x-ray imager exhibiting reduced ghosting effects and overvoltage protection by appropriate leakage current characteristics of the thin-film transistor array. A top electrode of a suitable material is directly on an amorphous selenium-based charge generator layer allowing charge transport across the layer, thereby reducing ghosting. Alternatively, a non-insulating organic layer may be between the top electrode and the charge generating layer. The thin-film transistors have leakage current that rises relatively slowly with voltage across the transistor within a range that matches exposure through an object being imaged but rises at a sufficiently higher rate within a higher range to provide protection even when a corresponding region of the charge generator layer receives greater amounts of x-rays. A voltage is applied to the top electrode. This voltage may be within the range of 500 V to 2,000 V.

25 Claims, 14 Drawing Sheets

U.S. PATENT DOCUMENTS

| | | | |
|---|---|---|---|
| 5,852,296 A | * | 12/1998 | Tsukamoto et al. .... 250/370.09 |
| 5,942,756 A | | 8/1999 | Tran |
| 6,243,441 B1 | * | 6/2001 | Zur ........................... 378/98.8 |
| 6,353,229 B1 | | 3/2002 | Polischuk et al. |
| 6,469,312 B2 | | 10/2002 | Agano |

OTHER PUBLICATIONS

Zhao W. et al., "Digital radiology using active matrix readout of amorphous selenium detectors with high voltage protection." Med Phys 25 (4), pp. 539-549 (1998).

Lee D. et al., "A new digital detector for projection radiography," SPIE vol. 2432, pp. 237-249; (1995).

Zhao W. et al., "A large area solid-state detector for radiology using amorphous selenium," SPIE Medical Imaging, vol. 1. 1651, pp. 134-143, (1992); and.

Polischuk B. et al., "Selenium direct converter structure for static and dynamic x-ray detection im medical imaging applications," SPIE Conference on Physics of Medical Imaging, San Diego, CA, Feb. 1998, SPIE vol. 3336, pp. 494-504.

* cited by examiner

AMORPHOUS SELENIUM FLAT PANEL X-RAY IMAGER FOR TOMOSYNTHESIS AND STATIC IMAGING

REFERENCE TO RELATED APPLICATION

The present application is a Continuation in Part of application Ser. No. 11/341,925, filed Jan. 27, 2006, now U.S. Pat. No. 7,233,005 which is a Continuation in Part of application Ser. No. 11/059,282, filed Feb. 16, 2005, now U.S. Pat. No. 7,122,803 the entire contents of which are herein incorporated by reference.

FIELD

This patent specification is in the field of radiography and pertains more specifically to x-ray imaging using a digital, flat panel x-ray imager.

BACKGROUND

Flat panel x-ray imaging devices that use charge generator materials such as doped amorphous selenium charge generator layers and directly convert x-rays to electrical charges and thus generate electrical signal related to local x-ray exposure, have been developed in recent years. See, for example U.S. Pat. No. 5,319,206, and Yorker J., Jeromin L., Lee D., Palecki E., Golden K., and Jing Z., "Characterization of a full field mammography detector based on direct x-ray conversion in selenium," Proc. SPIE 4682, 21-29 (2002). Commercial versions for general radiography and for mammography have been available for more than a year in this country from Hologic, Inc. of Bedford, Mass. ("Hologic") and Direct Radiography Corporation of Newark, Del. ("DRC"). The DRC imager is used in mammography systems that have been available for more than a year in this country from Lorad Corporation of Danbury, Conn. ("Lorad"). In such direct conversion panels, the charge generator material directly converts x-rays into pairs of electrons and holes and, under an applied electrical field, the holes and electrons migrate to respective electrodes with very little lateral loss to neighboring pixels. Direct conversion is believed to offer better spatial resolution and other advantages over indirect conversion panels, in which x-rays cause scintillation in a material such as cesium iodide and the resulting light energy is detected.

The structure of a direct conversion flat panel imager of the type referred to above is illustrated in principle but not to scale in FIG. 1. It comprises a top electrode 100, a charge barrier layer 102 (typically made of Parylene) separating the top electrode from an amorphous selenium-based charge generator layer 104, an electron blocking layer 106 patterned into a two-dimensional pixel array, a charge collection electrode 108 that also is patterned into a pixel array, a thin-film transistor ("TFT") array comprising respective transistors 110 coupled to the charge collection electrode and to respective signal storage capacitors 112, a substrate 114 typically made of glass, a gate pulse line 116 that enables (turns ON) the transistors to deliver to charge amplifiers 118 the charges collected at the respective storage capacitors, a programmable high voltage power supply 120. The illustrated equivalent capacitor circuit for a pixel comprises a capacitor 122 representing capacitance across the charge barrier layer, a capacitor 124 representing capacitance across the charge generator layer, and a capacitor 126 representing capacitance of the charge storage capacitor for the pixel. One of the functions of the charge barrier layer is protection of the thin-film transistors, which can suffer breakdown damage if the charge stored in the charge storage capacitors becomes too high, e.g. when a capacitor stores charges generated at a region of the charge generating layer that receives x-rays that have not been attenuated by the object being imaged. For example, in mammography the corners of the flat panel imager typically are outside the breast outline and can receive much more radiation than the part of the imager under the breast. The charge barrier layer protects such transistors by collecting charges that gradually reduce the electrical field in the appropriate portions of the charge generator layer, and thus reduce the amount of charge that would otherwise collect at the pertinent charge collection capacitors.

The charge barrier layer thus contributes to meeting one of the challenges in flat panel detectors, namely, breakdown protection of the thin-film transistors. Another challenge is ghosting (remnants of one or more previous images) due to the time it takes to dissipate charges collected in the imager from previous x-ray exposures. Various techniques have been developed and used commercially to remove or at least reduce ghosting to an acceptable level. They include charge erasing by exposure to visible light between x-ray exposures and various ways to manipulate the bias potential of electrodes between x-ray exposures. The time needed to attend to ghosting makes it difficult to take images in rapid succession, such as for fluoroscopy or tomosynthesis.

It has been reported that it would be impractical to use a direct conversion panel without a charge barrier layer. Thus, a 1998 paper by well-known researchers in the field of direct conversion panels states that direct metallization of a selenium based detector in theory would allow for rapid imaging but concludes based on experimental data that this gives non-reproducible and unstable results. Polischuk B., Shukri Z., Legros A., and Rougheout H., "Selenium direct converter structure for static and dynamic x-ray detection in medical imaging applications," SPIE Conference on Physics of Medical Imaging, San Diego, Calif., Feb. 1998, SPIE Vol. 3336, pp. 494-504, states that "In order to develop a selenium based x-ray detector which could operate in real time, i.e. 30 frames per second, a direct metallized selenium structure would be required. It is well established in solid-state theory that metallic electrodes deposited directly onto the free surface of semiconductor layers can behave as Schottky contacts." The paper then states that "most metals with lower work functions [than selenium] should have built-in potential barriers which could minimize the injection of excess charge from the metal electrode," but the paper reports that tests showed that "sample-to-sample variability and contact instability were common observations on these samples," and that "It was therefore concluded that any x-ray detector which relied only on the Schottky contact to limit dark currents would provide non-reproducible and unstable results." The paper proposes the solution of including a blocking layer between the top electrode and the selenium, and states that "The role of the top blocking layer is to limit the injection of positive charge from the metallic electrode, but allow any x-ray-generated electron to move unimpeded from the selenium layer to the metallic contact." The authors of the article are from Noranda Advanced Materials of Quebec, Canada, an entity that is believed to have been, at the time, a major developer of flat panel selenium-based x-ray imagers, in addition to DRC.

A number of earlier proposals have dealt with the issue of high voltage protection in flat panel detectors. U.S. Pat. No. 6,353,229, granted to the three authors of the 1998 paper and two other inventors, refers to several such proposals. One is cited at column 1, lines 24-39 and is reported to involve a special dual-gate TFT (thin-film transistor) structure that forms a back channel in the TFT structure if the pixel voltage exceeds a certain potential. See, Zhao W., Law J., Waechner D., Huang Z., and Rowlands J., "Digital radiology using active matrix readout of amorphous selenium detectors with high voltage protection," 1998 Med Phys 25 (4), pp. 539-549. Another is discussed at column 1, lines 46-57 (U.S. Pat. No. 5,198,673) and is said to involve the use of a second two-terminal protection device resident at each pixel location. The patent also refers, in the section entitled "Description of Prior Art," to a number of other items of prior art: (1) PCT International Application WO 96/22616 published Jul. 25, 1996; (2) Lee D., Cheung L. K., and Jeromin L., "A new digital detector for projection radiography," 1995, SPIE Vol. 2432, pp. 237-249; (3) U.S. Pat. Nos. 5,598,004 and 5,396,072 (stating that "no mention is made [in those patents] of the high voltage protection of the TFT array"); (4) U.S. Pat. No. 5,528,043 (stating that the patent "does not mention whether high voltage protection of the circuit from the selenium bias is achieved"); (5) U.S. Pat. No. 5,436,101 (stating that "there is no mention of any high voltage protection of any element on the substrate"); and (6) Canadian patent application 2,184,667 published Mar. 4, 1998 and corresponding EP 0 826 983 published the same day (stating that "no indication of how this structure could be used for high voltage protection is given").

U.S. Pat. No. 6,353,229 proposes to achieve high voltage protection "by setting the high voltage biasing electrode to a negative potential and the TFT "off" gate voltage to a predetermined negative value such that the TFT is essentially non-conductive." The patent recognizes that "there will always be some TFT leakage" but states that "the negative 'off' voltage may be adjusted so as to minimize the same and render the TFT essentially non-conductive." See column 2, lines 49-61.

Earlier papers and patents are believed to be consistent with the patents and papers cited above. See U.S. Pat. Nos. 5,132,541, 5,184,018, 5,396,072, and 5,942,756, and Zhao W. and Rowlands J. A., "A large area solid-state detector for radiology using amorphous selenium," SPIE Medical Imaging, Vol. 1. 1651, pp. 134-143, 1992. A more recent U.S. Pat. No. 6,469,312, illustrates in FIG. 2 an electrode 2 on a recording side photoconductive layer 3 containing amorphous selenium as a main component, but has a wavelength conversion layer 1 in front of an electrode layer 2, which serves as a scintillator so that the amorphous selenium layer 3 would serve as a light detector.

Each of the patents and papers cited above is hereby incorporated by reference in this patent specification as though fully set forth herein.

SUMMARY OF DISCLOSURE

This patent specification discloses a new approach that departs from, and in some ways contradicts, the proposals in the patents and papers cited above. The new approach includes placing a layer of non-insulating organic material between a top electrode and a selenium-based charge generator layer serving to directly convert x-rays to electrical charges, and may intentionally use leakage current of the TFT array transistors for protection. In the new approach, the leakage current characteristics of the TFT array transistors may provide an operating regime in which the leakage current may be relatively low for pixels that measure radiation within the typical range expected for the object being imaged but the leakage current may be sufficiently high to avoid transistor breakdown for pixels that receive more radiation, e.g. pixels that are outside the object being imaged and receive radiation that is not attenuated by the object, such as pixels at corners of the imager. In the new approach, the TFT leakage current regime may provide breakdown protection despite the absence of a charge barrier layer between the top electrode and the charge generator layer designed to protect from high voltage TFT breakdown.

In a preferred but non-limiting example, a layer of non-insulating organic material may be deposited or otherwise formed directly on the selenium-based layer. A top metal electrode may be deposited or otherwise formed directly on the non-insulating organic material. No charge blocking or insulating layer need be deliberately formed between the top electrode and the charge generator layer. The leakage current of the thin-film transistors may rise at a relatively low rate with voltage at the transistors up to a selected range but may rise much more steeply with voltage at the transistors above that range. As a non-limiting example for a specific circuit configuration, the leakage current rises at a low rate up to transistor voltage in the range of 20-25 volts but rises much more steeply with voltage above that range. At higher voltage, the steeply rising leakage current provides built-in protection against transistor breakdown. The range of 20-25 volts is only an example, and other ranges may be appropriate to accomplish protection in the case of differently structured TFT array transistors or imagers.

A voltage is applied to the top electrode. This voltage may be within the range of 500 V to 2,000 V.

As an alternative, the top electrode may be formed directly on the selenium-based charge generator layer.

DETAILED DESCRIPTION OF PREFERRED EMBODIMENTS

Figure 1:
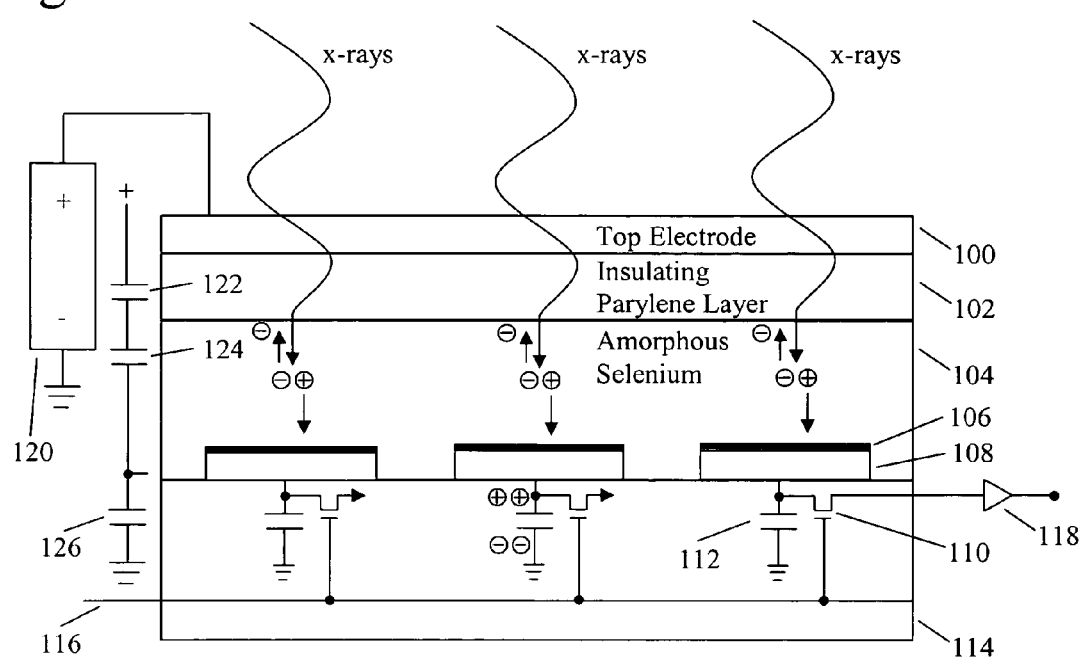
FIG. 1 illustrates a partial cross-section of a prior art x-ray imager panel.
Figure 2:
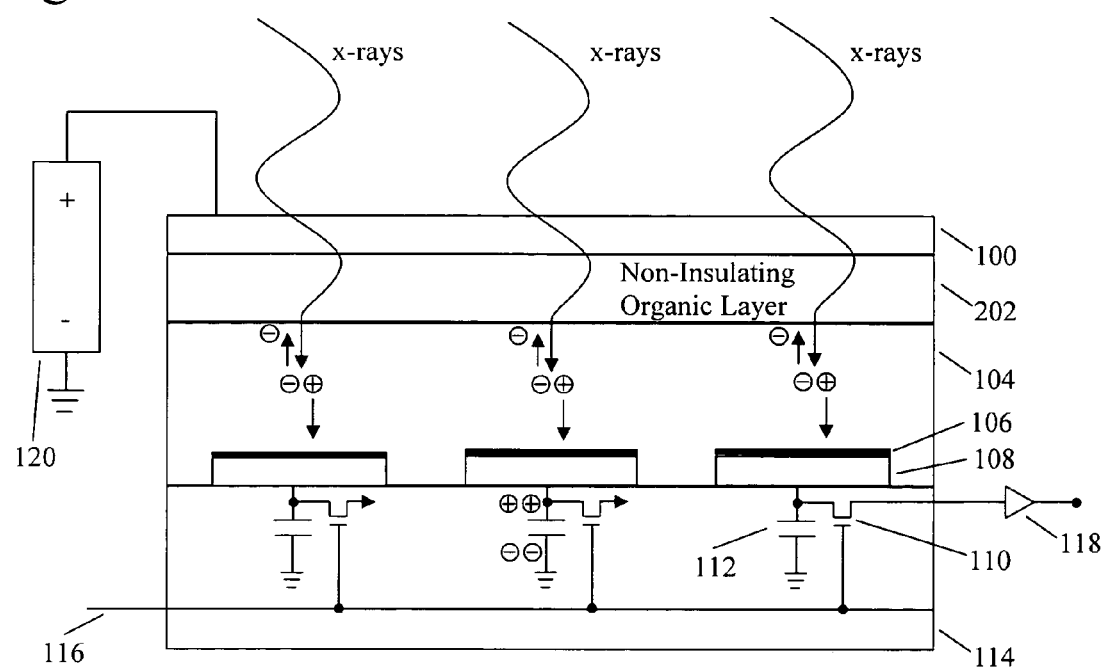
FIG. 2 illustrates a partial cross-section of an x-ray imager panel incorporating an example of the technology disclosed in this patent specification.

Referring to FIG. 2, a non-limiting example of an imager incorporating the teachings of this patent specification comprises a top metal electrode 100 deposited or otherwise formed directly on an electronically non-insulating organic material 202. The non-insulating organic material 202 may be deposited or otherwise formed directly on, an upper surface of an amorphous selenium-based charge generator layer 104. Unlike the case illustrated in FIG. 1, there is no deliberately deposited or otherwise formed electron barrier layer. A charge collection electrode 108 is patterned into a two-dimensional array of pixel electrodes that are under charge generator layer 104 or are embedded at a bottom surfaces thereof. An electron blocking layer 106 may cover pixel electrodes 108 (also called charge collection electrode). A read-out circuit is interposed between charge generator layer 104 and a substrate 114, and comprises respective signal storage capacitors 112 coupled electrically with the pixel electrodes and a thin-film transistor (TFT) array comprising respective gating transistors 110 coupled electrically with the junctions between the pixel electrodes and the signal storage capacitors. Transistors 110 are normally in an OFF state but can be enabled (turned ON) by a gating signal delivered over gate pulse line 116, to thereby deliver charge accumulated in signal storage capacitors to a charge amplifier 118. A programmable high voltage power supply 120 applies a positive potential to top electrode 100 relative to ground and to grounded signal storage capacitors 112, to thereby induce an electrical field in charge generator layer 104. Additional electrical fields can be generated as well, for example by forming and appropriately biasing special electrodes that extend into the underside of charge generator layer 104, between adjacent charger collector electrodes 108. FIG. 1 is not to scale, and omits well known components of an imaging panel, such as a protective layer over top electrode 100 (e.g. Parylene passivation over a top electrode, or any protective layer over the top electrode) and various other mechanical or electrical components that are a part of the imaging panel that has been available from DRC and used by Lorad for mammography and has 3584 by 4096 square pixels at 70 microns pitch over an active area of about 25 by 29 cm. The charge generator layer may be about 200 microns thick and may be thermally stabilized by controlled amounts of dopants. A voltage of about 1,000 volts across the charge generator layer may be used, resulting in an electric field of about 5 volts per micron thickness.

Figure 3:
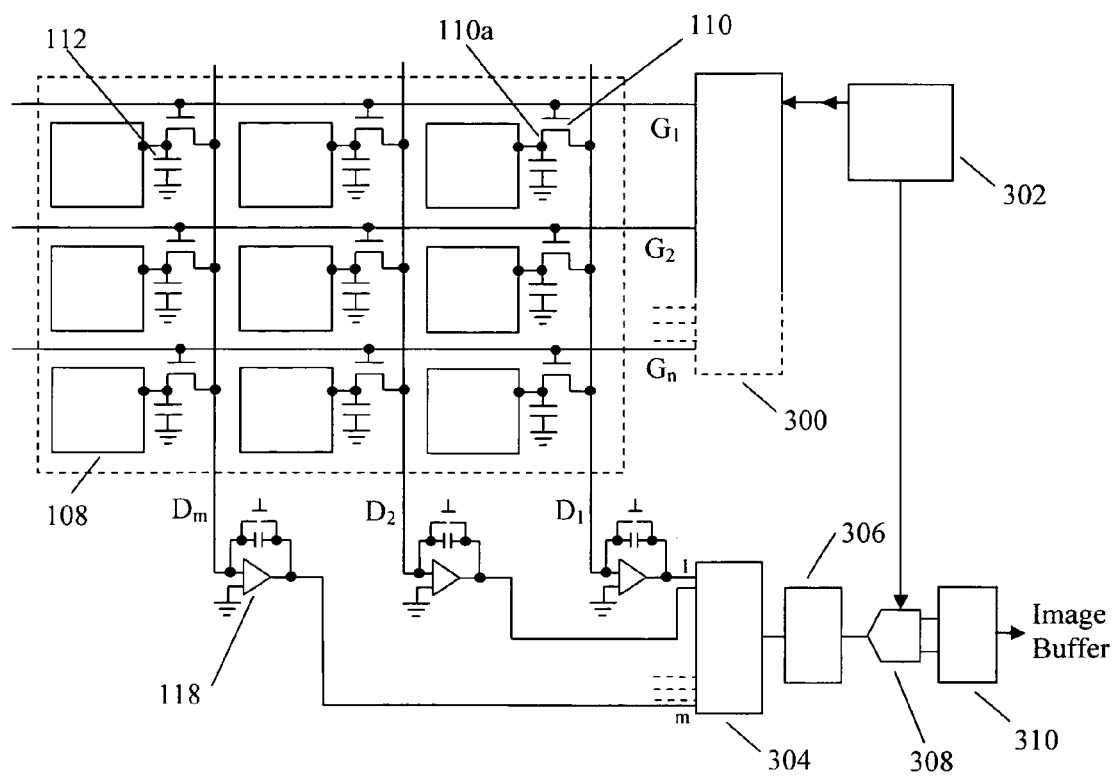
FIG. 3 is a partly block-diagram and partly circuit diagram of a portion of the imager of FIG. 2.

Referring to FIG. 3, the components that are the same as in FIG. 1 and FIG. 2 bear the same reference numerals. The additional components are: additional gate pulse lines $G_2 \ldots G_n$ that are similar to line 116 ($G_1$) but serve other rows of transistors 110, a gate driver 300 directed by a controller 302 to selectively enable transistors 110 in the respective rows, and column readout lines $D_1 \ldots D_m$ that feed the outputs of transistors 110 in respective columns to sample-and-hold (S/H) circuits 304. A multiplexer 306 takes the output of circuits 304 and feeds analog-to-digital converters (ADC) 308, also controlled by controller 302. Digitized pixel values from ADC 308 are delivered to serial data port 310 and then to an image buffer, from which they can be taken for appropriate processing into image data for display, storage, transmission, etc. The pixel charges can be read out individually, or several pixels (e.g. an array of 2 by 2 pixels) can be binned into a single sample for higher reading speed at the expense of spatial resolution. The panel can be operated in a static mode for screening mammography, for example at a 28 kVp, MO/MO spectrum provided by an x-ray generator from Lorad designated M4, with an image cycle of 30 seconds and at a source-detector distance of 65 cm. For test purposes, an exposure range of 1 to 16 mR can be used, which subsumes the typical dose of 1-10 mR for breast cancer screening. Alternatively, the panel can be operated in a dynamic, tomosynthesis mode, for example using a 28 kVp, Mo/Rh spectrum, with an image cycle of 0.5 or 1.0 seconds and 2×2 pixel binning, and at exposure range of about 0.5-1.5 mR per image, i.e. at a dose range per image of about a factor of 10 less than for the static, screening mode so that about 10 or 11 images can be taken in dynamic, tomosynthesis mode in one sweep of stop-and-expose imaging.

The non-insulating organic layer (202 of FIG. 2) may be a hole-blocking layer and may prevent positive charge from traveling from the power source 120 and the top electrode 100 to the charge generating layer 104. However, the non-insulating organic layer 202 may permit negative charge to flow from the charge generating layer 104 to the top electrode 100. The non-insulating organic layer 202 may therefore prevent hole injection at the top metal-semiconductor interface and therefore decrease the detector dark current (signal detected in the absence of x-rays). Decreasing dark current may increase the dynamic range of the detector and decrease the noise in the image. The non-insulating organic layer may be, for example, an organic semiconductor. Examples of organic semiconductors that may be used include: phthalocyanines (Pc), oxidiazols and oxazoles, polythiophenes, pentacenes, oligothiophenes, TCNQ (tetracyanoquinodimethane), TDEA (tetrakis demethylaminoethane), tetracarboxylic dianhydride, fullerenes (C60, C70), arylalkanes, arylamines, polysilylenes, polygermanes, PVK (poly-vinylcarbazole) and related compounds, and pyrazolines. The listed organic semiconductors are given as examples and are not offered as an exclusive list of all non-insulating organic layers that may be used according to embodiments of the present invention.

According to one embodiment of the present invention, the non-insulating organic layer may be of a thickness within the range of 50 Angstroms to 10,000 Angstroms. It is believed that a thickness within this range would be effective.

Figure 4:
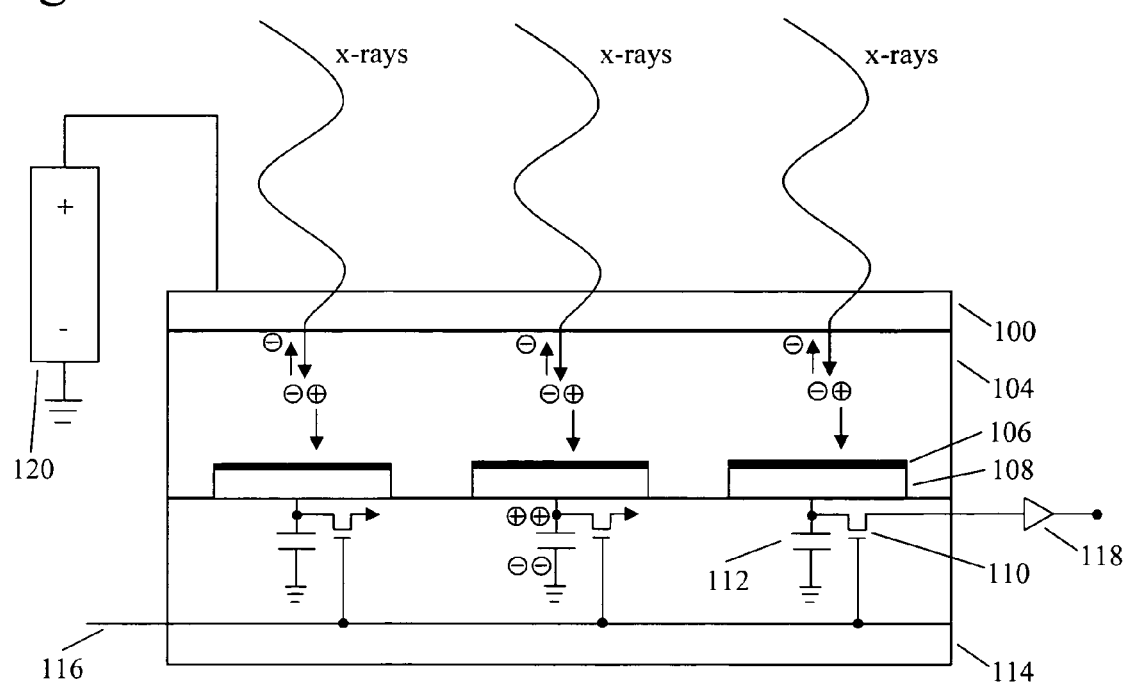
FIG. 4 illustrates a partial cross-section of an x-ray imager panel incorporating another example of the technology disclosed in this patent specification.

According to another embodiment of the present invention shown in FIG. 4, the top-electrode 100 may be directly in contact with the charge generating layer 104. In this embodiment, there is neither a Parylene layer as used in the prior art detector shown in FIG. 1 nor a non-insulating organic layer as used in other embodiments of the present invention shown in FIG. 2.

Both embodiments of the present invention (FIGS. 2 and 4) may have similar characteristics and advantages over the prior art approach as shown in FIG. 1. For example, both embodiments may allow for tomographic imaging in the range of, for example, 30 frames per second. As stated above, both embodiments of the present invention may utilize the imager circuitry shown in FIG. 3.

Figure 5:
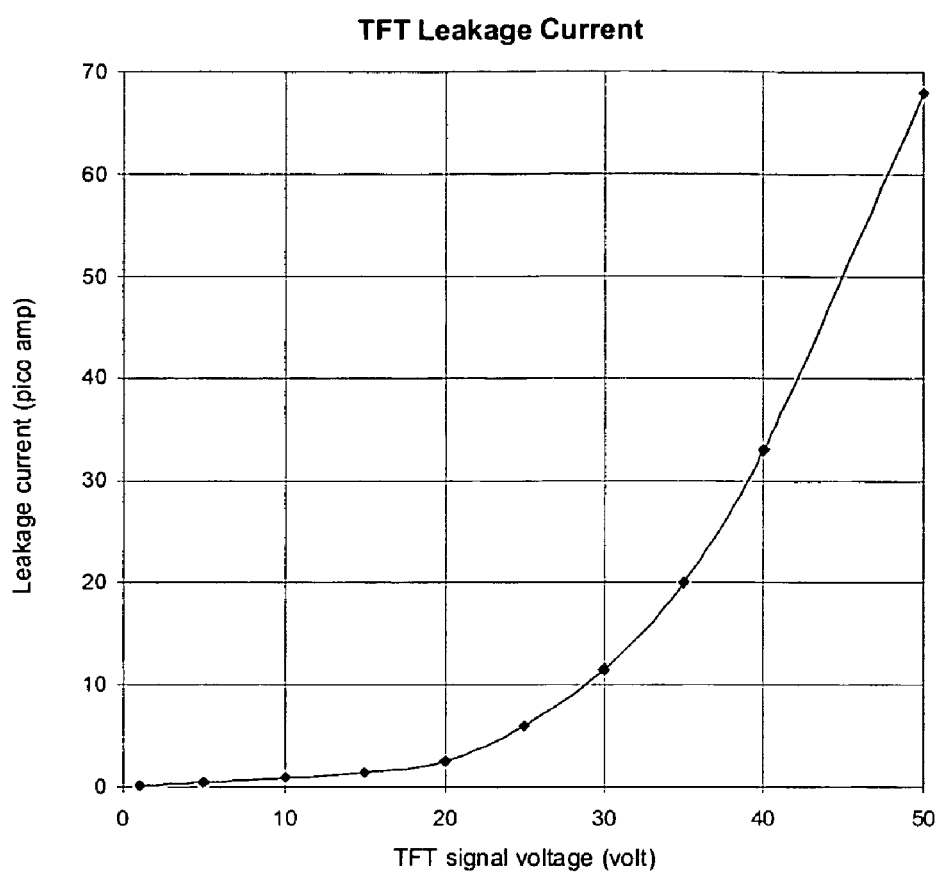
FIG. 5 illustrates voltage vs. leakage current characteristic of a thin-film transistor used in FIG. 4.

FIG. 5 illustrates leakage current characteristics of a thin-film transistor 110 that are particularly important for the operation of the imager of FIGS. 3 and 4. As seen in this specific example of a transistor, when the transistor is in its OFF state, and the voltage at the transistor drain 110a (at the junction between the respective signal storage capacitor 112 and pixel electrode 108) is less than about 20 volts, or at least less than somewhere in the range of about 20-25 volts, the leakage current of the transistor rises at a relatively low rate. However, with the transistor still in its OFF state, the leakage current rises at a significantly higher rate (more steeply) with rise in the voltage at 112a above the range of about 20-25 volts. In the example, the inflection point between low and high rates of leakage current rise is closer to 20 volts than to 25 volts. In this example, the rise above the inflection point is progressively steeper. While the exact point of inflection or range in which the point of inflection occurs may vary depending on the details of a particular TFT array, the important feature is that the leakage increase at a sufficiently high rate above a voltage range appropriate for a particular use of an imager panel to avoid voltage breakdown of (or overvoltage damage to) the transistors.

According to one embodiment of the present invention, the leakage current of each of the transistors is less than 2 pA at transistor voltage of 20 volts and more than 20 pA at transistor voltage of 35 volts.

Figure 6:
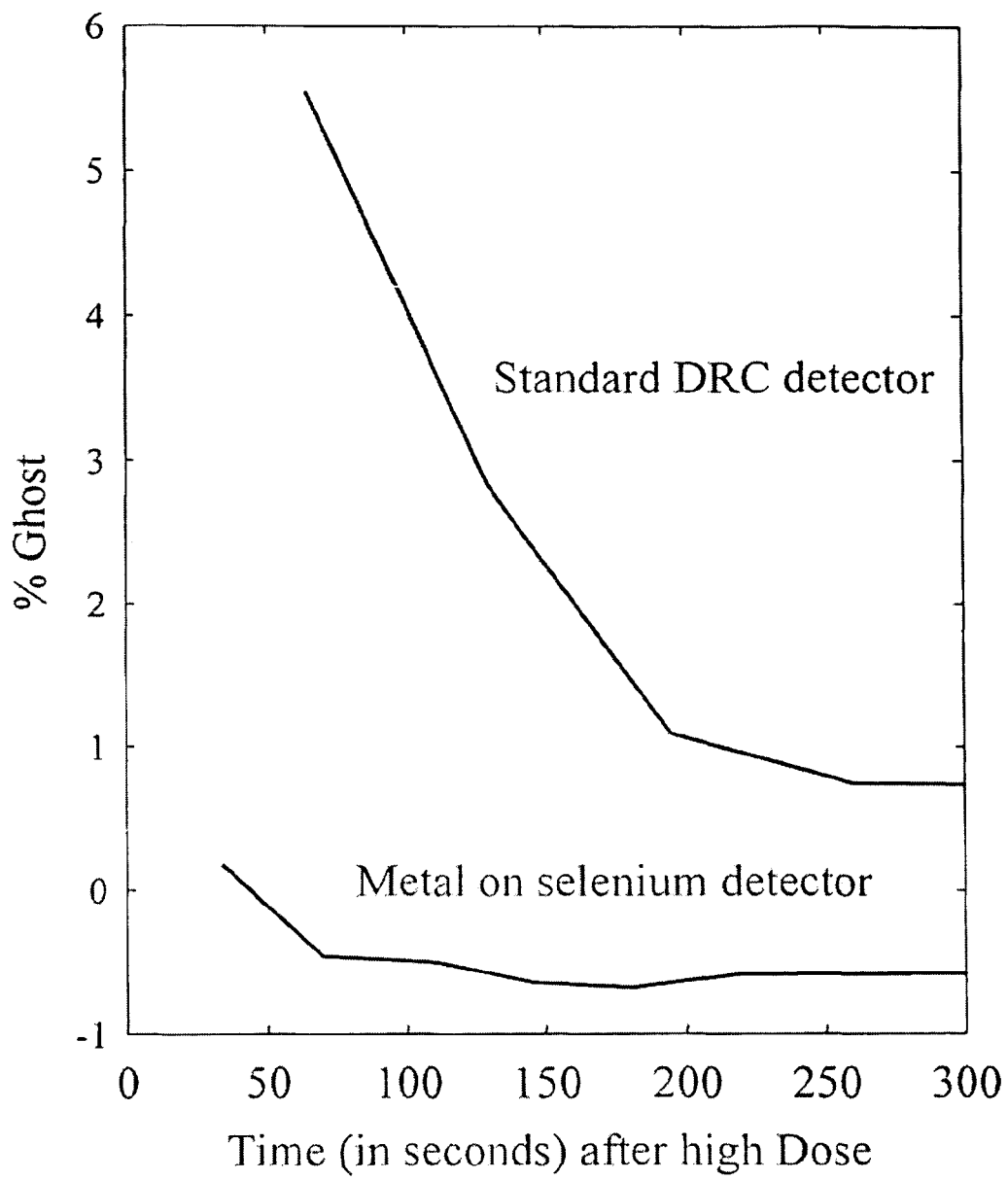
FIG. 6 illustrates a comparison of ghosting characteristics of an imager using the disclosure of this patent specification and a prior art imager.

As illustrated in FIG. 6, one of the benefits of an x-ray imager of the types illustrated in FIGS. 2-4 is a dramatic decrease in ghosting effects as compared with a prior art imager of the type illustrated in FIG. 1. FIG. 6 compares ghosting of an imaging panel currently sold by Direct Radiography Corporation (standard DRC detector, as illustrated in FIG. 1) with an otherwise similar panel of the type illustrated in FIG. 4 (metal on selenium detector). A significant difference between the two detectors (x-ray imaging panels) is that the standard DRC detector has a charge barrier layer (layer 102 in FIG. 1) while in the detector according to embodiments of the present invention may have either the top electrode 100 in direct contact with the charge generator layer 104 or a non-insulating organic layer 202 between the top electrode 100 and the charge generator layer 104. Indeed, the three panels can be otherwise identical, with identical TFT arrays. However, transistors 110 according to the embodiment of the present invention shown in FIGS. 2 and 4 may operate in a different regime, in which they are allowed to extend the voltage at drain 110a into a range that the insulating charge barrier layer 102 in the standard DRC detector was designed to prevent.

The low ghosting that detectors of embodiments of the present invention exhibit (the x-ray imagers of FIGS. 2 and 4) may allow for rapid imaging as compared with the standard DRC detector of FIG. 1. While the x-ray imagers of FIGS. 2-4 may use technology for erasing ghost images between x-ray exposures that is the same or similar to those used in the imagers currently sold by Direct Radiology Corporation, in the alternative it may be possible to use the imager of FIGS. 2-4 without such erasing.

The top electrode 100 typically is elemental metal or an alloy or inorganic oxide such as Indium-Tin Oxide (ITO), but an organic conductor may be used instead. The material of top electrode 100 preferably has a lower work function than the charge generator layer 104. Preferably, top electrode 100 is made of a material that would allow a free flow of negative charge from the charge generator layer 104 to the non-insulating organic layer 202 into electrode 100 while inhibiting the injection of positive charge from electrode 100 to the non-insulating organic layer 202 into charge generating layer 104. Preferably, but not necessarily, the material of top electrode 100 has the following characteristics: work function<4.0 electron volt; electrical resistivity<55 μΩ·cm; atomic number<60. Further, the material of top electrode 100 preferably is chemically stable when in contact with the non-insulating organic layer 202 or charge generating layer 104, is not flammable in solid form and is neither explosive nor corrosive, is not too toxic or carcinogenic or radioactive, and allows the formation of top electrode 100 by a deposition or other process compatible with forming the remaining structure of the imaging panel. Chromium (Cr) is believed to be an example of a suitable material that meets the criteria set forth above, for example in thickness within the range of about 50 to about 10,000 Angstroms, although other thicknesses also may be suitable.

Chromium is believed to be a suitable material for forming the top electrode, in part, because it has a low atomic number of 24 and therefore absorbs very little x-ray radiation when deposited in thin layers. Additionally, owing to its high melting temperature ($T_c$=1875° C.), its diffusion coefficient to selenium at room temperature is very low. This pay prevent formation of a Cr-Se alloy layer that could significantly degrade imager performance by creating a large and unstable dark current signal.

Having the top electrode be too thick or too thin may reduce structural integrity during manufacture and/or operation and/or increase x-ray absorption level to an unacceptable level. Therefore selecting an optimal top electrode thickness is beneficial.

Through experimentation, it has revealed that a layer of chromium within the range of about 150 Angstroms to about 2,000 Angstroms produces satisfactory results and it is believed that a layer of chromium within the range of about 50 Angstroms to about 10,000 Angstroms would also produce satisfactory results.

ITO and Al in elemental form or as the predominant metal in an alloy with each other or with other elements, also are believed to be examples of suitable materials. Another consideration is thermal expansion compatibility with selenium, which may impose conditions on the composition, thickness, or formation technology of the top electrode.

The ability to rely on transistor leakage current to avoid breakdown under the expected operating conditions an x-ray imaging panel may be surprising given common assumptions in x-ray imaging technology. For example, in mammography uses of the prior art panel illustrated in FIG. 1 that had been commercially available, it had been believed that without a charge barrier layer 102 such a high amount of charge would accumulate at the individual signal storage capacitors 112 that the capacitor voltage would rise to a level sufficiently high to damage the dielectric in the capacitor and/or the channel in the thin film transistor 110, leading to permanent damage of the imaging panel. One calculation assumes that the leakage current is zero, and estimates that under mammography x-ray energies the imaging panel is accumulating $4.58 \times 10^{-15}$ Coulomb per mR per pixel. If the maximum x-ray exposure rate is 5R/second, then the maximum accumulated charge at capacitor 112 is $2.3 \times 10^{-11}$ Coulomb in 1 second. This theoretical calculation leads to a voltage of 34.7 volts across signal storage capacitor 112. In practice, in the case of a large and dense breast, the exposure rate is closer to 3 R/second. While this is the estimate assuming there is no leakage current, actual measurements of the TFT in the current mammography imaging panels (FIG. 1) supplied by DRC indicate a rapidly increasing drain-to-source leakage current with increasing voltage over about 20-25 volts. At about 30 volts at the drain, the leakage current is interpolated to be 24 pA, just enough to leak away excess charge as the signal storage capacitor potential roses over 25 volts. This rapidly rising leakage current thus becomes a self-protecting mechanism, which in turn allows dispensing with a charge barrier layer such as 102 (FIG. 1) and its ghosting effects.

Figure 7A:
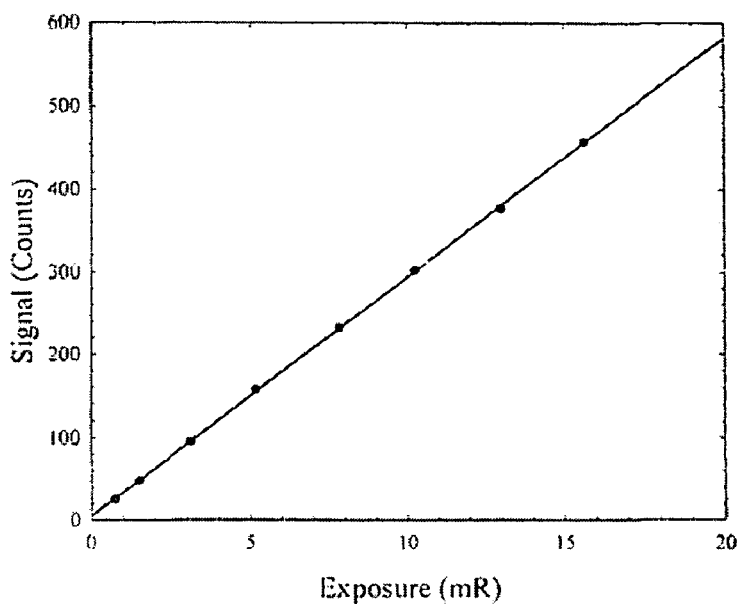
FIGS. 7A and 7B show graphs illustrating linearity of an imager according to FIG. 4 in screening mode and in tomosynthesis mode, respectively.
Figure 8A:
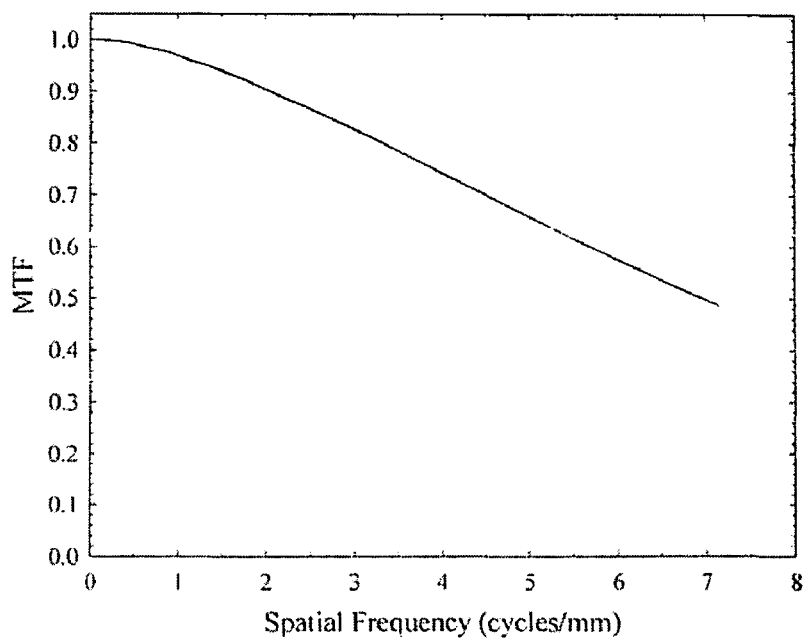
FIGS. 8A and 8B show graphs illustrating modulation transfer function (MTF) of an imager according to FIG. 4 in screening mode and in tomosynthesis mode, respectively.
Figure 9:
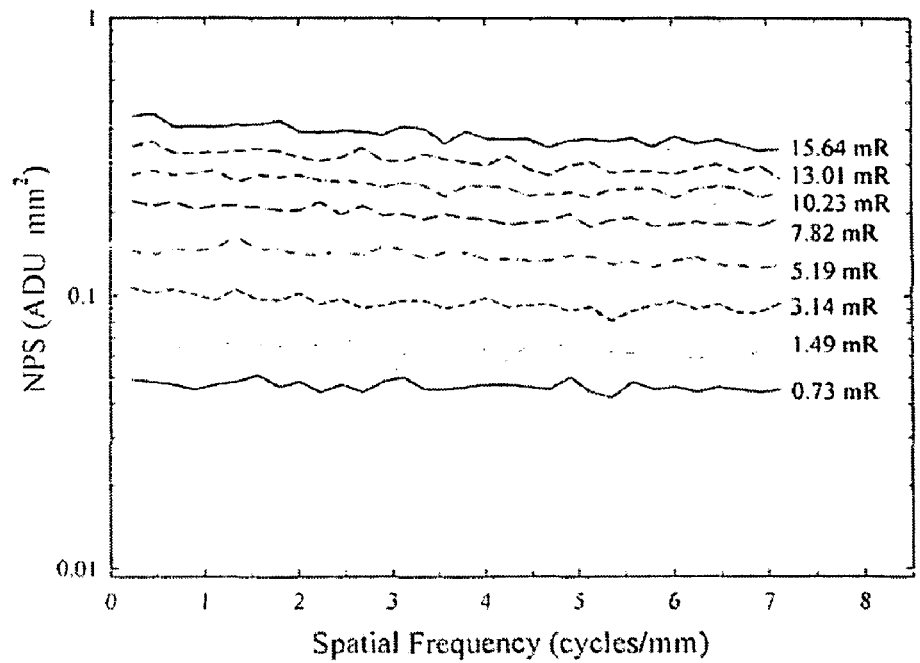
FIG. 9 shows a graph illustrating noise power spectrum (NTS) of an imager according to FIG. 4 in screening mode.
Figure 10A:
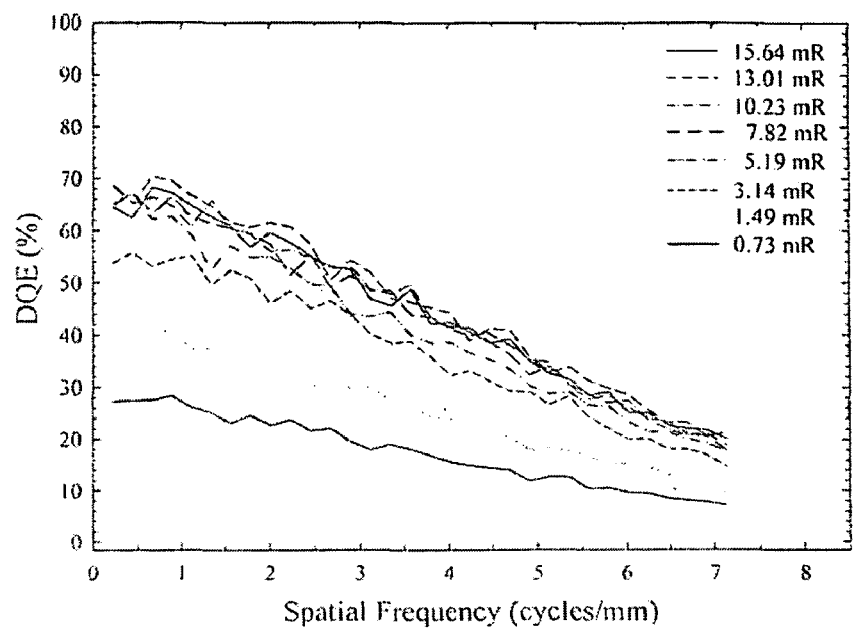
FIGS. 10A, 10B, and 10C show graphs illustrating detector quantum efficiency (DQE) of an imager according to FIG. 4 in screening mode and in tomosynthesis mode, respectively.
Figure 10B:
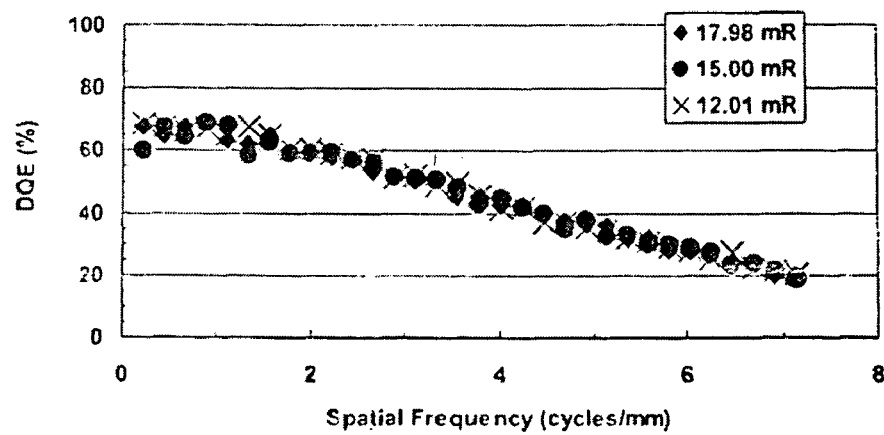
Figure 11:
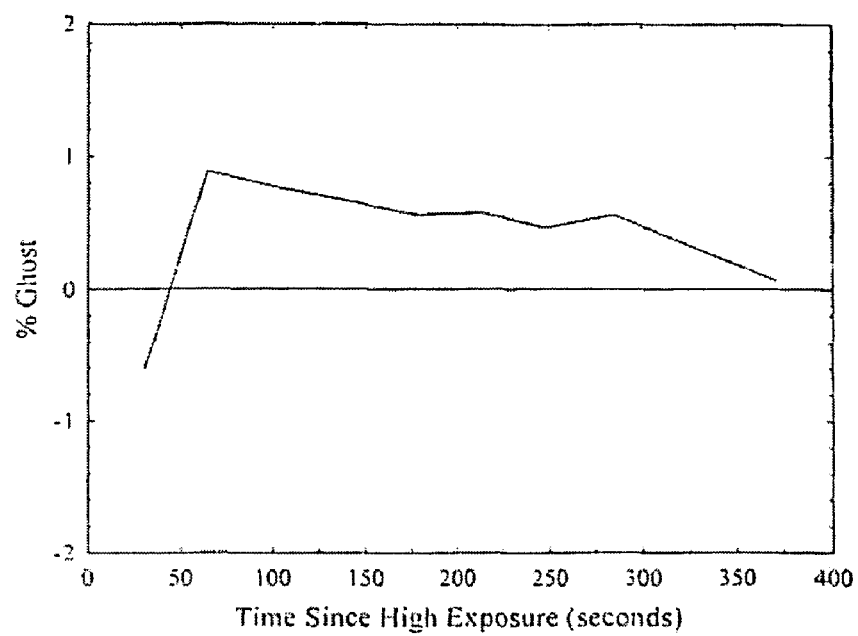
FIG. 11 shows a graph illustrating ghost (%) characteristics of an imager according to FIG. 4 in screening mode.

Tests and calculations for the screening mode of a mammography panels according to FIGS. 2-4, at the parameters set forth above, suggest:

Good linearity at the expected exposure range (see FIG. 7A);

Good presampling modulation transfer function (MTF) (see FIG. 8A);

Good noise power spectrum (NPS) as a function of spatial frequency for different exposure over the expected range (see FIG. 9);

Good efficiency expressed as detective quantum efficiency (DQE) as a composite parameter that measures the efficiency of an imaging system in transferring the input signal to noise ratio at the output according to the expression $DQE(f,X) = (S(X) \times MTF(f))^2 / (\Phi(X) \times NPS(f,X))$ where S(X) is the measured signal at a certain exposure X, $\Phi(X)$ is the incident photon fluence per unit area at exposure X (see FIGS. 10A-10B); and Good ghosting characteristics as a function of elapsed time (see FIG. 11) in a test where the imager was exposed to a large "ghost" exposure of 2.6 R with a 28 kVp, Mo/Mo spectrum, with part of the imaging surface being covered by a piece of 1.0 mm thick sheet of lead. 30 seconds later, the first read frame was acquired at a much lower dose of 9 mR, with the lead removed and the x-ray beam filtered through 4 cm of Lucite. The mean detector signals in a 256 by 256 pixel region of interest inside and outside the Lucite phantom location were compared, and ghosting magnitude was calculated as the normalized difference:

Ghost (%)=((signal(inside)—signal(outside))/signal (inside)×100%.

Figure 7B:
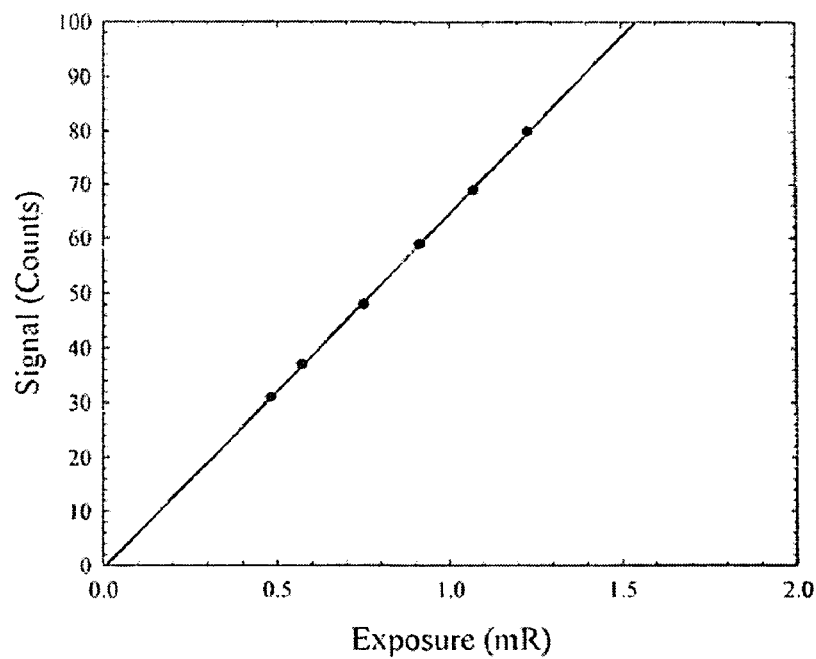
Figure 8B:
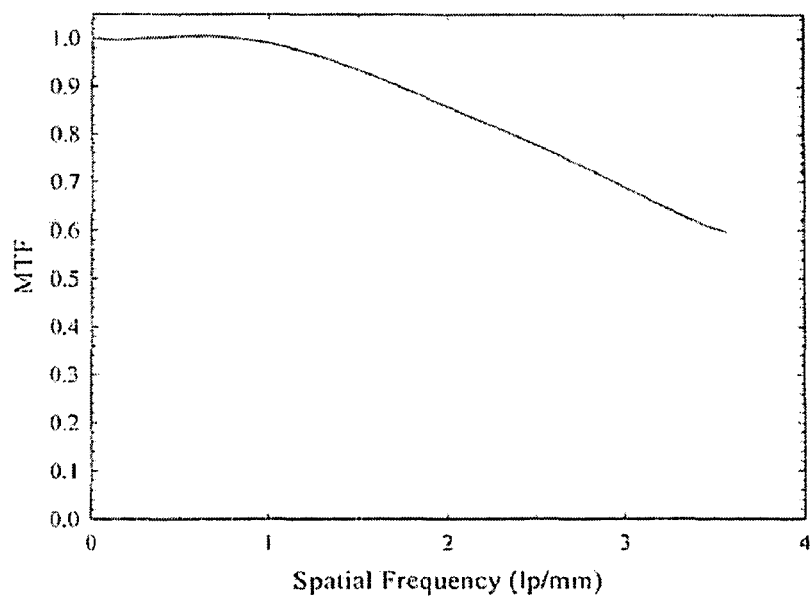
Figure 10C:
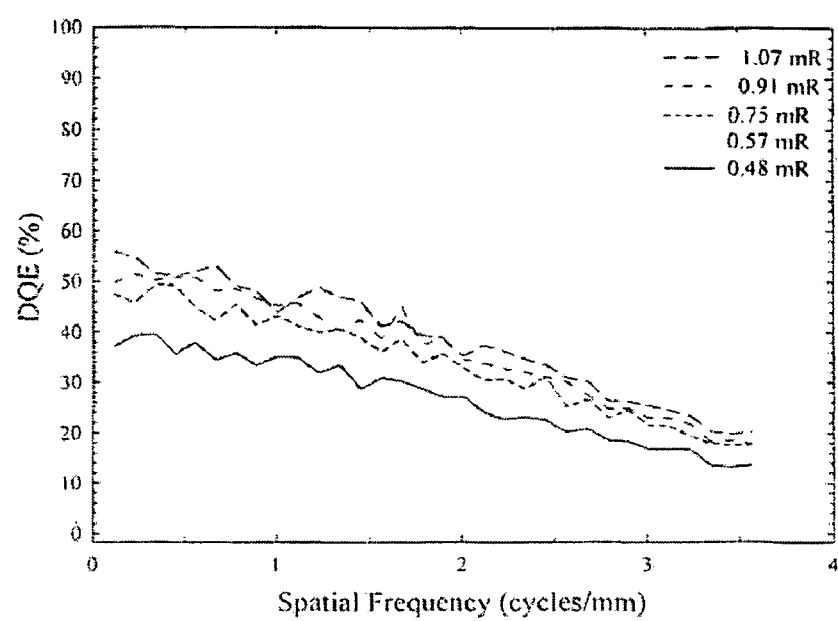
Figure 12:
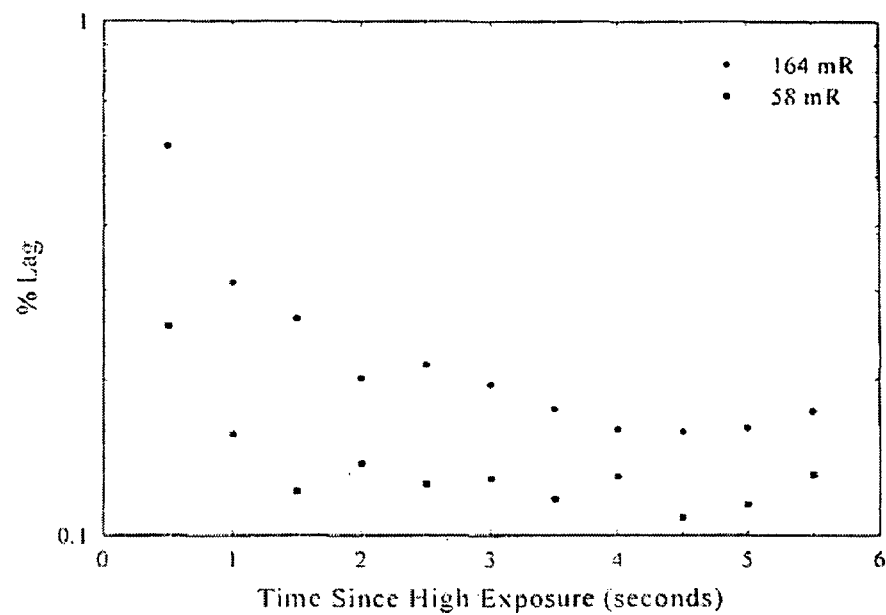
FIG. 12 shows a graph illustrating image lag as a function of elapsed time of an imager according to FIG. 4 in tomosynthesis mode.
Figure 13:
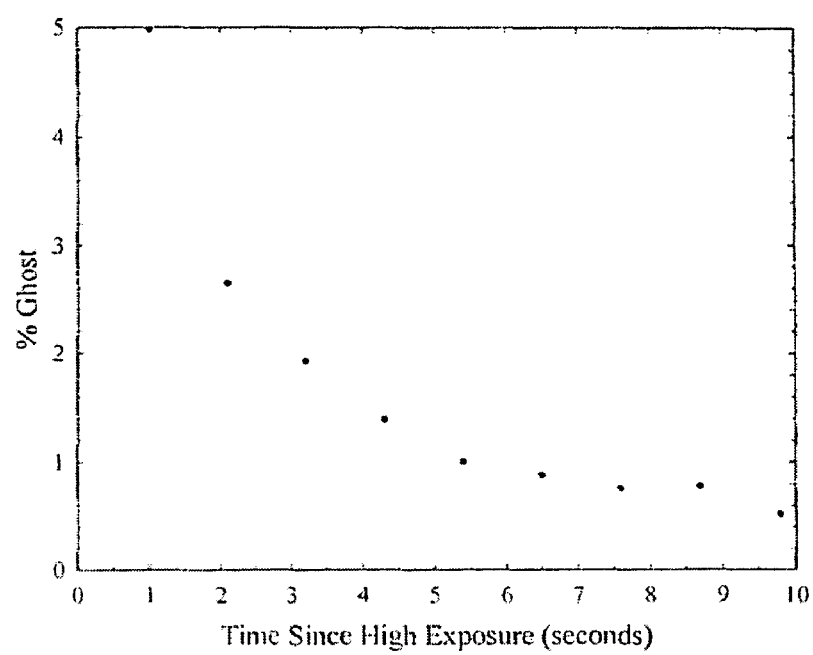
FIG. 13 shows a graph illustrating residual image ghost as a function of time of an imager according to FIG. 4 in tomosynthesis mode.

Tests and calculations for the tomosynthesis mode of a mammography panels according to FIGS. 2-4, at the parameters set forth above, also suggest:

Good linearity at the expected exposure range (see FIG. 7B);

Good presampling modulation transfer function (MTF) (see FIG. 8B);

Good efficiency (FIG. 10C) expressed as detective quantum efficiency (DQE) calculated using the methodology used in the screening mode but at the tomosynthesis parameters;

Good image lag characteristics (FIG. 12), where lag was investigated by exposing the imager to a single high exposure at 28 kVp with half the imaging area covered by a 1.0 mm thick sheet of lead, then reading out a series of dark image frames at 0.5 second intervals. Two tests were done, one with a high dose of 164 mR, the other with 58 mR. Lag was calculated as the normalized difference in the dark counts between the unshielded area exposed to the high dose and the other half that was shielded by the lead:

Lag (%)=((dark counts(unshielded)—dark counts (shielded))/dark counts (shielded)×100%; and Good residual image ghost as a function of time (FIG. 13), investigated by exposing the imager to a high ghost exposure of 177 mR with a 36 kVp Mo/Rh spectrum, with a part of the imager covered with a 4.2 cm thick acrylic block. A series of read dose images then followed at 1.0 second intervals, with the acrylic block removed and at 5.29 mR for each image frame.

According to embodiments of the present disclosure that include the insulating Parylene layer 102 or another intentionally formed or deliberately added insulating layer between the top electrode 100 and the charge generating layer 104, for example as seen in FIG. 1, the voltage applied to the top electrode 100 may be 2.75 kV. This voltage may be applied by the programmable high voltage power supply 120. This voltage may be used to establish an electric field that permeates the charge generating layer 104 and affects electron-hole pair generation and the transport and collection of charge carriers within the charge generating layer.

At around 2.75 kV, the detector DQE (detective quantum efficiency, MTF (modulation transfer function), sensitivity, etc. have been found to be at acceptable levels.

According to embodiments of the present disclosure that do not include the insulating Parylene layer 102, for example as seen in FIGS. 2 and 4, the voltage applied to the top electrode 100 may be less than the voltage applied in the embodiments that include the insulating Parylene layer 102. This is because when used, the insulating Parylene layer 102 serves to reduce the voltage across the charge generating layer 104. Additionally, the Parylene-selenium interface can trap charge and therefore reduce the effective electric field across the charge generating layer 104.

For example, voltage within the range of 750 V to 1,000 V have been used for embodiments that do not include the insulating Parylene layer 102. It has been shown that using voltage within this range produces results (detector DQE, MTF, sensitivity, etc.) that are consistent with the use of 2.75 kV for embodiments that include the insulating Parylene layer 102.

Moreover, for embodiments of the present disclosure that do not include the insulating Parylene layer 102, voltages in excess of 750 V are believed to be effective. For example, a voltage of up to 2000 V may be used. This is because the x-ray photogeneration efficiency for electron-hole pair generation in the charge generating layer 104 is known to be electric field dependent, increasing with electric field. Additionally, the transport and collection of charge carriers, both electrons and holes, across the charge generating layer 104 is promoted by higher electric field. It is therefore expected that the x-ray signal would increase when applying a higher voltage, for example, 1500, or 2000 volts.

After approximately 2000 volts, it is believed that the dark current, which also increases with higher electric field, may reach an unacceptable level. Therefore a preferred voltage may be up to 2000 volts.

Moreover, for embodiments of the present disclosure that do not include the insulating Parylene layer 102, voltages below 750 V are believed to be effective. Applied voltages below 750 V may reduce system noise, particularly when the x-ray detectors of the present disclosure are used for tomographic imaging. By reducing the level of noise, the signal to noise ratio (S/N) for the x-ray detector may be increased for a particular x-ray exposure level (dose).

DQE is ideally proportional to detector output (S/N) squared. Therefore, as system noise decreases, DQE increases, except for very low x-ray dose levels. Therefore, lower applied voltages may be used to achieve a desired DQE level. It is therefore expected that voltages as low as 500 volts would be effective.

Accordingly, a preferred embodiment of the present disclosure, that does not include the insulating Parylene layer 102, utilizes a voltage within the range of 500 V to 2,000 V. Accordingly, another preferred embodiment of the present disclosure, that does not include the insulating Parylene layer 102, utilizes a voltage within the range of 500 V to 1,000 V. Accordingly, another preferred embodiment of the present disclosure, that does not include the insulating Parylene layer 102, utilizes a voltage within the range of 750 V to 1,000 V. Accordingly, another preferred embodiment of the present disclosure, that does not include the insulating Parylene layer 102, utilizes a voltage within the range of 750 V to 2,000 V. Accordingly, another preferred embodiment of the present disclosure, that does not include the insulating Parylene layer 102, utilizes a voltage of 1,000 V.

The graphs discussed above are for a specific configuration of an example of a panel, and it should be clear that different results may be obtained with different embodiments of the invention set forth in the appended claims or with different test conditions.

It should be understood that the disclosure above illustrates only non-limiting examples of the claimed inventions, that variations will occur to those skilled in the pertinent technologies, and that the scope of the inventions recited in the appended claims is not limited to those examples.

The invention claimed is:

1. A digital, flat panel x-ray mammography imager exhibiting low ghosting, said imager having a top electrode directly on a selenium-based layer and having a thin-film transistor array with leakage current characteristics providing breakdown protection even when a transistor is coupled with a charge storage capacitor collecting charges from a region of the layer receiving x-rays that are not attenuated by an object being imaged in medical imaging, comprising:
   a substrate having an upper surface;
   a selenium-based charge generator layer over the upper surface of the substrate, said selenium-based layer also having an upper surface;
   a top electrode directly on, and in physical and electrical contact with, the upper surface of the charge generator layer;
   a charge collection electrode between the substrate and the charge generator layer, said charge collection electrode being patterned into a two-dimensional array of pixel electrodes;
   said charge generator layer generating electrical charge in response to x-ray irradiation, and said pixel electrodes collecting charge of one polarity generated at respective regions of the charge generator layer when one or more selected electric fields are established in the charge generator layer;
   a read-out circuit, also between the substrate and the charge generator layer, said read-out circuit comprising respective signal storage capacitors coupled with said pixel electrodes and storing electrical charge collected thereby, and further comprising a thin-film transistor array of respective gating transistors coupled with said signal storage capacitors;
   wherein each of said gating transistors is selectively switched between an ON state in which it passes charge from the respective storage capacitors to an outside circuit and an OFF state in which it passes leakage current;
   wherein the leakage current of each of said gating transistors rises at a relatively low rate with rise in potential at the respective capacitor below the range of 20-25 volts but rises at a significantly higher rate with rise in potential at the respective capacitor above said range, thereby protecting the transistors from breakdown damage even when the respective pixel electrode collects charge generated at a region of the charge generator layer receiving x-rays that are not attenuated by an object being imaged with said imager in medical imaging; and
   a power supply applying a voltage within the range of 500 V to 2,000 V to the top electrode.

2. The imager as in claim 1, wherein the power supply applies a voltage within the range of 500 V to 1,000 V.

3. The imager as in claim 1, wherein the power supply applies a voltage within the range of 750 V to 1,000 V.

4. The imager as in claim 1, wherein the power supply applies a voltage within the range of 750 V to 2,000 V.

5. The imager as in claim 1, wherein the power supply applies 1,000 V.

6. A digital, flat panel x-ray imager exhibiting low ghosting and rapid recovery time, comprising:
   a substrate and a selenium-based charge generator layer over the substrate;
   a top electrode directly on, and in physical and electrical contact with, an upper surface of the charge generator layer;
   a charge collection electrode between the substrate and the charge generator layer, said charge collection electrode being divided into a two-dimensional array of pixel electrodes;
   a read-out circuit, also between the substrate and the charge generator layer, said read-out circuit comprising respective signal storage capacitors coupled with said pixel electrodes and storing electrical charge collected thereby from the charge generating layer, and further comprising a thin-film transistor array of respective gating transistors coupled with said signal storage capacitors;
   wherein each of said gating transistors is selectively switched between an ON state in which it passes charge from the respective storage capacitors to an outside circuit and an OFF state in which it passes leakage current;
   wherein the leakage current of each of said gating transistors rises at a relatively low rate with rise in potential at the respective capacitor up to a threshold level but rises at a significantly higher rate with rise in potential at the respective capacitor above said level, thereby protecting the transistors from breakdown damage; and
   a power supply applying a voltage within the range of 500 V to 2,000 V to the top electrode.

7. The imager as in claim 6, wherein the power supply applies a voltage within the range of 500 V to 1,000 V.

8. The imager as in claim 6, wherein the power supply applies a voltage within the range of 750 V to 1,000 V.

9. The imager as in claim 6, wherein the power supply applies a voltage within the range of 750 V to 2,000 V.

10. The imager as in claim 6, wherein the power supply applies 1,000 V.

11. A medical x-ray imaging method comprising:
    providing a digital, flat panel x-ray imager comprising a top electrode layer formed directly on, and in electrical contact with, one major surface of an amorphous selenium-based charge generating layer, and a thin film transistor (TFT) array at an opposite major surface of the charge generating layer, said TFT array comprising respective gating transistors coupled with signal storage elements collecting charge generated at respective regions of the charge generating layer in response to x-ray irradiation;
    carrying out medical imaging an object with said imager, said object attenuating x-rays irradiation some but not all of said regions of the charge generating layer;
    said transistors having leakage current that is sufficiently low at transistor voltages that correspond to irradiation through the object to allow imaging the object but is sufficiently high at transistor voltages that correspond to irradiation not attenuated by the object to resist transistor breakdown; and applying a voltage within the range of 500 V to 2,000 V to the top electrode layer.

12. The method of claim 11, wherein the applied voltage is within the range of 500 V to 1,000 V.

13. The method of claim 11, wherein the applied voltage is within the range of 750 V to 1,000 V.

14. The method of claim 11, wherein the applied voltage is within the range of 750 V to 2,000 V.

15. The method of claim 11, wherein the applied voltage is 1,000 V.

16. A digital, flat panel x-ray imager exhibiting low ghosting and rapid recovery time, comprising:
a substrate having an upper surface;
a selenium-based charge generator layer on the upper surface of the substrate responsive to x-rays to generate electrical charges;
a non-insulating organic layer directly on, and in physical contact with, an upper surface of the selenium-based charge generator layer;
a top electrode directly on, and in physical contact with, an upper surface of the non-insulating organic layer;
a charge collection electrode between the substrate and the charge generator layer, said charge collection electrode being divided into a two-dimensional array of pixel electrodes;
a read-out circuit, also between the substrate and the charge generator layer, said read-out circuit comprising respective signal storage capacitors coupled with said pixel electrodes and storing electrical charge collected thereby from the charge generating layer, and further comprising a thin-film transistor array of respective gating transistors coupled with said signal storage capacitors;
wherein each of said gating transistors is selectively switched between an ON state in which it passes charge from the respective storage capacitors to an outside circuit and an OFF state in which it passes leakage current;
wherein the leakage current of each of said gating transistors rises at a relatively low rate with rise in potential at the respective capacitor below the range of 20-25 volts but rises at a significantly higher rate with rise in potential at the respective capacitor above said range; and a power supply applying a voltage within the range of 500 V to 2,000 V to the top electrode.

17. The imager as in claim 16, wherein the power supply applies a voltage within the range of 500 V to 1,000 V.

18. The imager as in claim 16, wherein the power supply applies a voltage within the range of 750 V to 1,000 V.

19. The imager as in claim 16, wherein the power supply applies a voltage within the range of 750 V to 2,000 V.

20. The imager as in claim 16, wherein the power supply applies 1,000 V.

21. A medical x-ray imaging method comprising:
providing a digital, flat panel x-ray imager comprising an amorphous selenium-based charge generating layer that generates electrical charges in response to x-rays, a non-insulating organic layer on a top surface of the charge generating layer, and a top electrode on a top surface of the non-insulating organic layer, and a thin film transistor (TFT) array on a bottom surface of the charge generating layer, said TFT array comprising respective gating transistors coupled with signal storage elements collecting charge generated at respective regions of the charge generating layer in response to x-ray irradiation;
carrying out medical imaging an object with said imager, said object attenuating x-rays irradiation some but not all of said regions of the charge generating layer; and
said transistors having leakage current that is sufficiently low at transistor voltages that correspond to irradiation through the object to allow imaging the object but is sufficiently high at transistor voltages that correspond to irradiation not attenuated by the object to resist transistor breakdown; and
applying a voltage within the range of 500 V to 2,000 V to the top electrode layer.

22. The method of claim 21, wherein the applied voltage is within the range of 500 V to 1,000 V.

23. The method of claim 21, wherein the applied voltage is within the range of 750 V to 1,000 V.

24. The method of claim 21, wherein the applied voltage is within the range of 750 V to 2,000 V.

25. The method of claim 21, wherein the applied voltage is 1,000 V.

* * * * *